United States Patent
Duane et al.

(10) Patent No.: US 6,376,350 B1
(45) Date of Patent: Apr. 23, 2002

(54) METHOD OF FORMING LOW RESISTANCE GATE ELECTRODE

(75) Inventors: Michael P. Duane, Round Rock; Jeffrey C. Haines; Frederick N. Hause, both of Austin, all of TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/792,766

(22) Filed: Feb. 23, 2001

(51) Int. Cl.$^7$ ................................ H01L 21/3205
(52) U.S. Cl. ................................ 438/592; 438/299
(58) Field of Search .................. 438/592, 587, 438/299–307

(56) References Cited

U.S. PATENT DOCUMENTS

| | | | | |
|---|---|---|---|---|
| 5,940,698 A | * | 8/1999 | Gardner et al. | 438/197 |
| 5,960,270 A | * | 9/1999 | Misra et al. | 438/197 |
| 6,001,717 A | * | 12/1999 | Lien | 438/586 |
| 6,140,688 A | * | 10/2000 | Gardner et al. | 257/412 |
| 6,143,613 A | * | 11/2000 | Iin | 438/299 |
| 6,184,113 B1 | * | 2/2001 | Seo et al. | 438/585 |

FOREIGN PATENT DOCUMENTS

JP 62117329 * 5/1987 ......... H01L/21/302

* cited by examiner

Primary Examiner—Charles Bowers
Assistant Examiner—Thanh Nguyen
(74) Attorney, Agent, or Firm—Williams, Morgan & Amerson, P.C.

(57) ABSTRACT

The present invention is directed to a method of forming a semiconductor device. In one illustrative embodiment, the method comprises forming a layer of polysilicon and forming a recess in the layer of polysilicon. The method further comprises forming a metal region in the recess and patterning the layer of polysilicon to define a gate stack comprised of the metal region and the layer of polysilicon.

14 Claims, 4 Drawing Sheets

METHOD OF FORMING LOW RESISTANCE GATE ELECTRODE

BACKGROUND OF THE INVENTION

1. Field of the Invention

The present invention is generally directed to the field of semiconductor processing, and, more particularly, to a method of forming a semiconductor device having a low resistance gate electrode.

2. Description of the Related Art

There is a constant drive within the semiconductor industry to increase the operating speed of integrated circuit devices, e.g., microprocessors, memory devices, etc. This drive is fueled by consumer demands for computers and electronic devices that operate at increasingly greater speeds. By way of background, FIG. 1 depicts an illustrative NMOS field effect transistor 10 formed above a surface 14 of a semiconducting substrate 12 between trench isolation regions 25. The transistor 10 is comprised of a gate dielectric 16, a gate electrode 18, a plurality of sidewall spacers 20 and multiple source/drain regions 28. The transistor 10 is further comprised of metal silicide contacts 21 formed on the source/drain regions 28 and on the gate electrode 18. These metal silicide contacts 21 are typically relatively thin, e.g., on the order of 200–300 Å.

The aforementioned demand for increased operating speed of integrated circuit devices has resulted in a continual reduction in the size of semiconductor devices, e.g., transistors. That is, the size of many components of a typical field effect transistor, e.g., channel length, source/drain junction depths, gate dielectric thickness, etc., are reduced. For example, all other things being equal, the smaller the channel length of the transistor, the faster the transistor will operate. Thus, there is a constant drive to reduce the size, or scale, of the components of a typical transistor to increase the overall speed of the transistor, as well as integrated circuit devices incorporating such transistors. However, some metal suicides, like titanium silicide, do not scale very well. That is, as linewidths are reduced, the resistance can increase rapidly.

As the channel length has been reduced to obtain the desired switching characteristic, the length (in the transverse direction) of the gate electrode 18 has also been reduced. Since the gate electrode 18 may only be electrically connected at one end, the electrical charges used to establish a transverse electrical field for forming the channel between the source/drain regions 28 of the transistor 10 have to be transported along the entire width (in the longitudinal direction) of the gate electrode, i.e., along the direction into the drawing page of FIG. 1. Given the small length of the gate electrode 18, the electrical resistance is relatively high, which may result in higher RC-delay time-constants. Hence, generation of the transverse electrical field used to fully open the channel is delayed, thereby deteriorating the switching time of the transistor. As a consequence, the rise and fall times of the electrical signals are increased and the operating frequency, i.e., the clock frequency, is reduced. Thus, the switching time of the transistor is no longer limited by the drain and source characteristics, but rather signifi- cantly depends on the delay associated with signal propagation along the gate electrode 18, i.e., the transistor performance depends, at least in part, on the resistance of the gate electrode 18 in the longitudinal direction of the gate electrode 18, i.e., in the gate width direction. The problem is even more pronounced as the width (i.e., in the longitudinal direction) increases.

Moreover, another problem encountered with device scaling is that some metal suicides, e.g., titanium silicide, do not scale very well. That is, as the length (in the transverse direction) of the gate electrode 18 is reduced, the resistance of the metal silicide regions formed above the gate electrode 18 can increase very rapidly.

The present invention is directed to a method of making a semiconductor device that may minimize or reduce some or all of the aforementioned problems.

SUMMARY OF THE INVENTION

The present invention is directed to a method of forming a semiconductor device. In one illustrative embodiment, the method comprises forming a layer of polysilicon and forming a recess in the layer of polysilicon. The method further comprises forming a metal region in the recess and patterning the layer of polysilicon to define a gate stack comprised of the metal region and the layer of polysilicon.

BRIEF DESCRIPTION OF THE DRAWINGS

The invention may be understood by reference to the following description taken in conjunction with the accompanying drawings, in which like reference numerals identify like elements, and in which.

Figure 1:
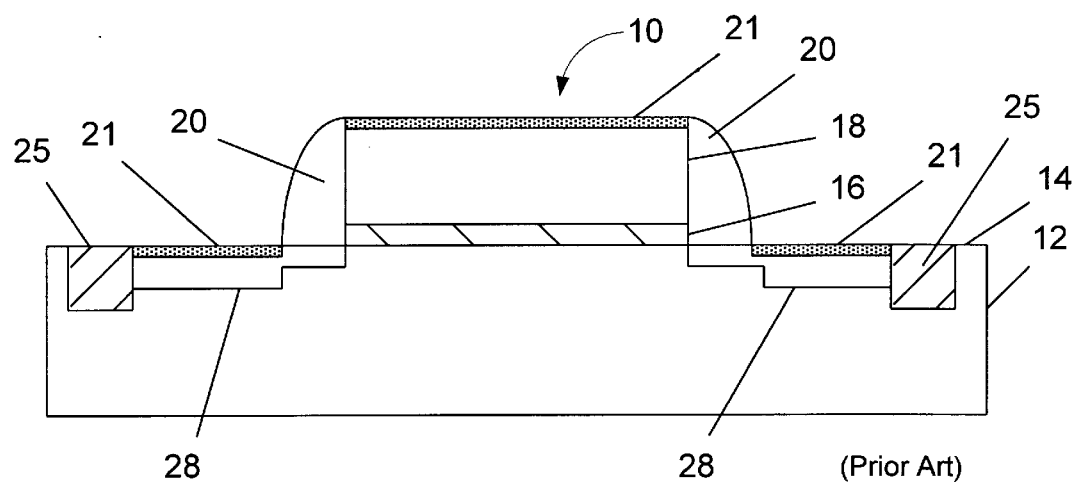
FIG. 1 is a cross-sectional view of an illustrative prior art field effect transistor.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to FIGS. 2–7. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features depicted in the drawings may be exaggerated or reduced as compared to the size of those feature sizes on fabricated devices. Nevertheless, the attached drawings are included to describe and explain illustrative examples of the present invention.

In general, the present invention is directed to a method of making a semiconductor device having a low resistance gate electrode. As will be readily apparent to those skilled in the art upon a complete reading of the present application, the present method is applicable to a variety of technologies, e.g.. NMOS, PMOS, CMOS, etc., and is readily applicable to a variety of devices, including, but not limited to, logic devices, memory devices, etc.

Figure 2:
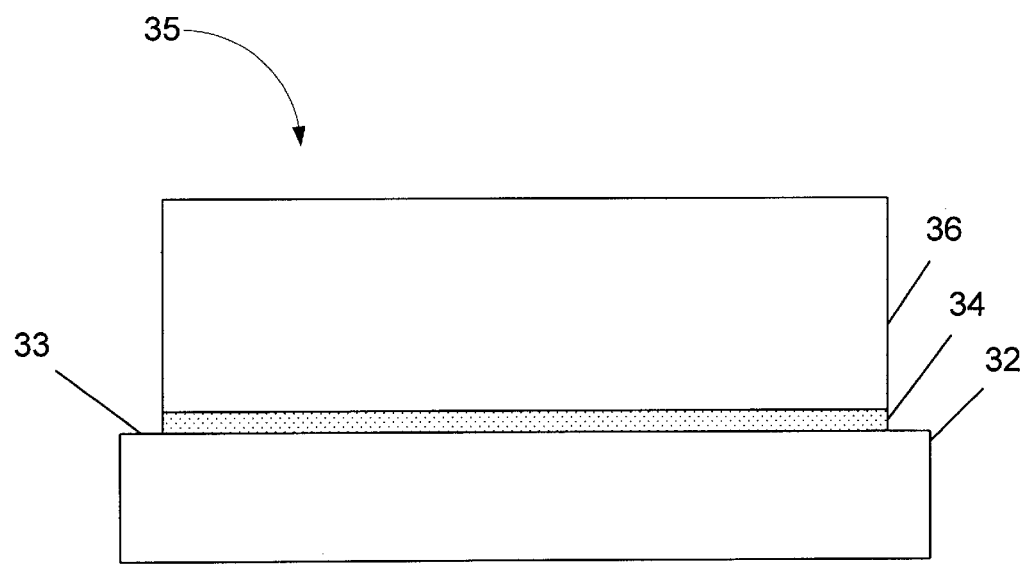
FIG. 2 is a cross-sectional view of a partially formed field effect transistor.

As shown in FIG. 2, a partially formed NMOS field effect transistor 35 is formed above a surface 33 of a semiconducting substrate 32. Although the transistor 35 depicted in FIGS. 2–7 is an NMOS transistor, the present invention is not limited to any particular technology. At this stage of fabrication, the transistor 35 is comprised of a gate dielectric layer 34 and a gate electrode layer 36.

In general, the particular materials and techniques used to form the various layers depicted in FIG. 2, e.g., the gate dielectric layer 34 and the gate electrode layer 36, are matters of design choice, and, thus, should not be considered a limitation of the present invention. For example, the gate dielectric layer 34 may be comprised of silicon dioxide, silicon oxynitride, etc., and it may be formed by a thermal growth or deposition process. Similarly, the gate electrode layer 36 may be comprised of a doped polycrystalline silicon (polysilicon), and it may be formed by a physical vapor deposition ("PVD") or a chemical vapor deposition ("CVD") process. In one illustrative embodiment, the gate dielectric layer 34 is comprised of a thermally grown layer of silicon dioxide having a thickness of approximately 20–60 Å. Similarly, in one embodiment, the gate electrode layer 36 is comprised of a layer of polysilicon having a thickness ranging from approximately 1000–2500 Å that is formed by a PVD process. If desired, the gate electrode layer 36 may also be doped with an appropriate dopant material, e.g., arsenic for NMOS technology, boron for PMOS technology, etc., to reduce the resistance of the gate electrode layer 36 and to assist in controlling the threshold voltage of the finished transistor.

Figure 3:
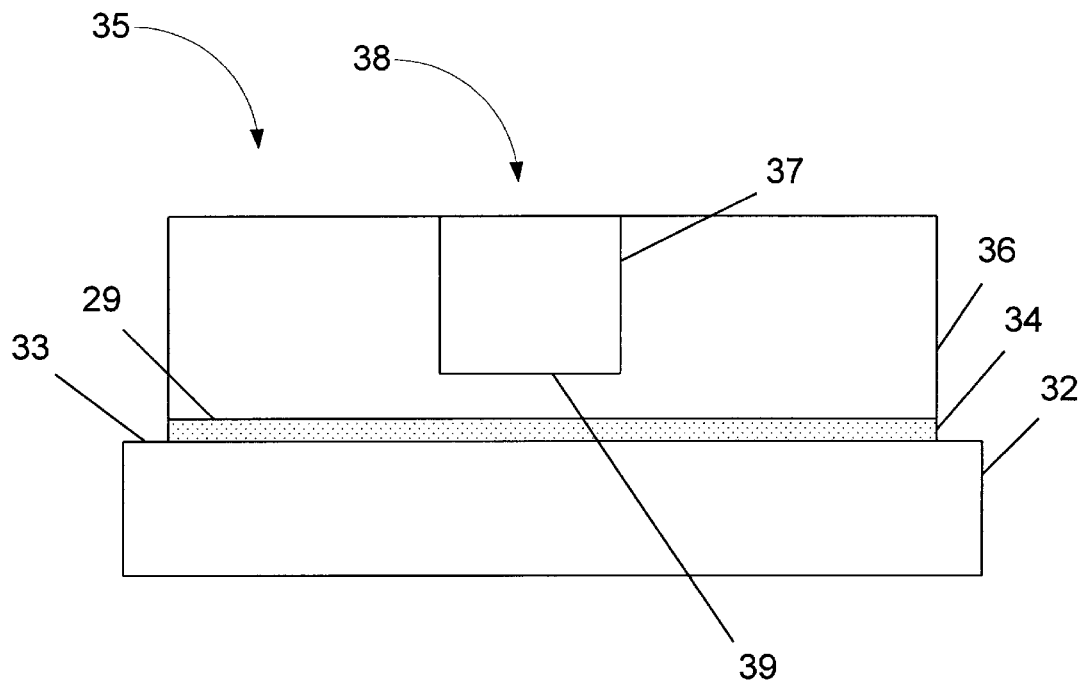
FIG. 3 is a cross-sectional view of the device in FIG. 2 after it has been subjected to a patterning operation.

Next, as shown in FIG. 3, a recess 38 is formed in the gate electrode layer 36. In one illustrative embodiment, the recess 38 is an elongated rectangular recess having sidewalls 37 and a bottom 39. Of course, the particular size and configuration of the recess 38 may be varied as a matter of design choice, and, thus, should not be considered a limitation of the present invention unless specifically set forth in the appended claims. In one illustrative embodiment, the recess 38 may be formed so as to have a width of approximately 1000 Å and a depth into the layer of polysilicon 36 ranging from approximately 1000–2000 Å. Such a configuration may result in an aspect ratio in the range of approximately 1:1 to 2:1. Additionally, note that the recess 38 is formed such that approximately 500 Å or more of the gate electrode layer 36 is positioned between the bottom surface 39 of the recess 38 and a top surface 29 of the gate dielectric layer 34. Again, these relative dimensions are provided by way of example only and should not be considered a limitation of the present invention unless specifically set forth in the appended claims. As will become clear after a complete reading of the present application, the polysilicon positioned between recess 38 and the gate dielectric layer 34 will assist in setting the threshold voltage for the completed device.

The recess 38 may be formed using a variety of known photolithographic and etching processes. For example, a layer of photoresist (not shown) may be formed above the gate electrode layer 36 and patterned so as to expose the portion of the gate electrode layer 36 in which it is desired to form the recess 38. Thereafter, an etching process, e.g., an anisotropic etching process, may be performed to define the recess 38 in the gate electrode layer 36. The depth of the recess 38 may be controlled by a timed etch process.

Figure 4:
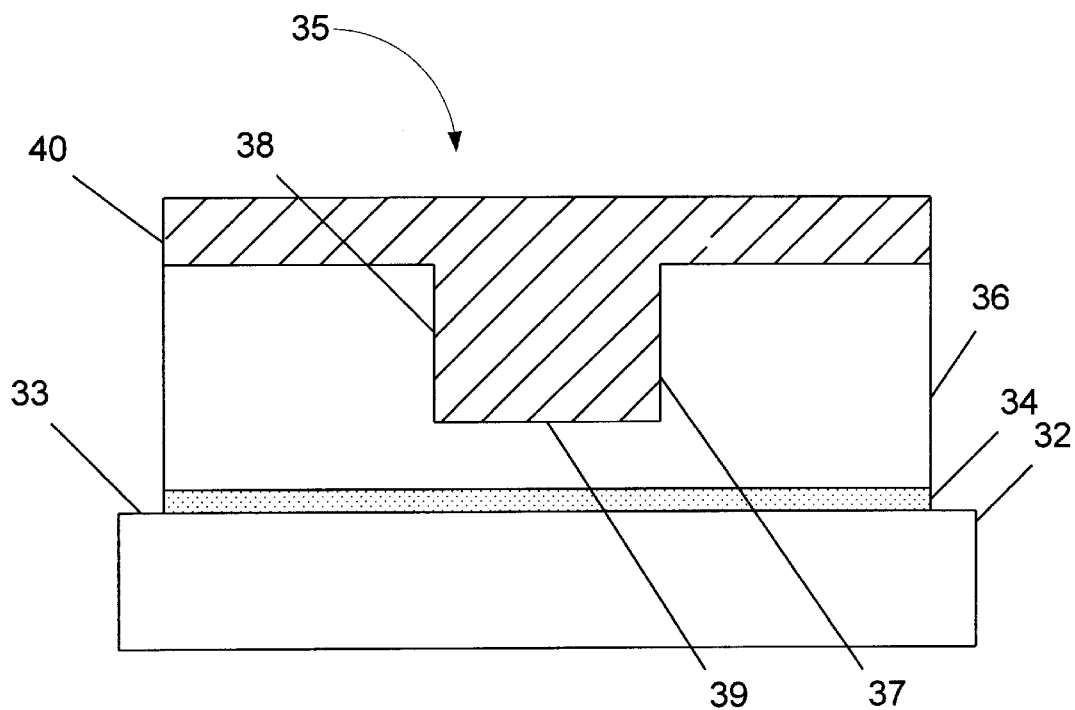
FIG. 4 is a cross-sectional view of the device depicted in FIG. 3 after a layer of metal has been formed thereabove.

Next, as shown in FIG. 4, a metal layer 40 is formed above the gate electrode layer 36 and in the recess 38 formed therein. The metal layer 40 may be comprised of any metal suitable for use as a portion of a gate electrode of a semiconductor device that has sufficient stability and integrity to withstand subsequent semiconductor processing operations. For example, the metal layer 40 may be comprised of copper, titanium, tungsten, titanium nitride, aluminum, etc. The metal layer 40 may be formed by any of a variety of techniques, e.g, CVD, PVD, etc. The thickness of the metal layer 40 may be varied as a matter of design choice, however, it should be thick enough so as to fill the recess 38 and provide some additional material above the gate electrode layer 36. In one illustrative embodiment, the metal layer 40 is comprised of a layer of tungsten having a thickness ranging from approximately 2000–4000 Å that is formed by a chemical vapor deposition process.

Figure 5:
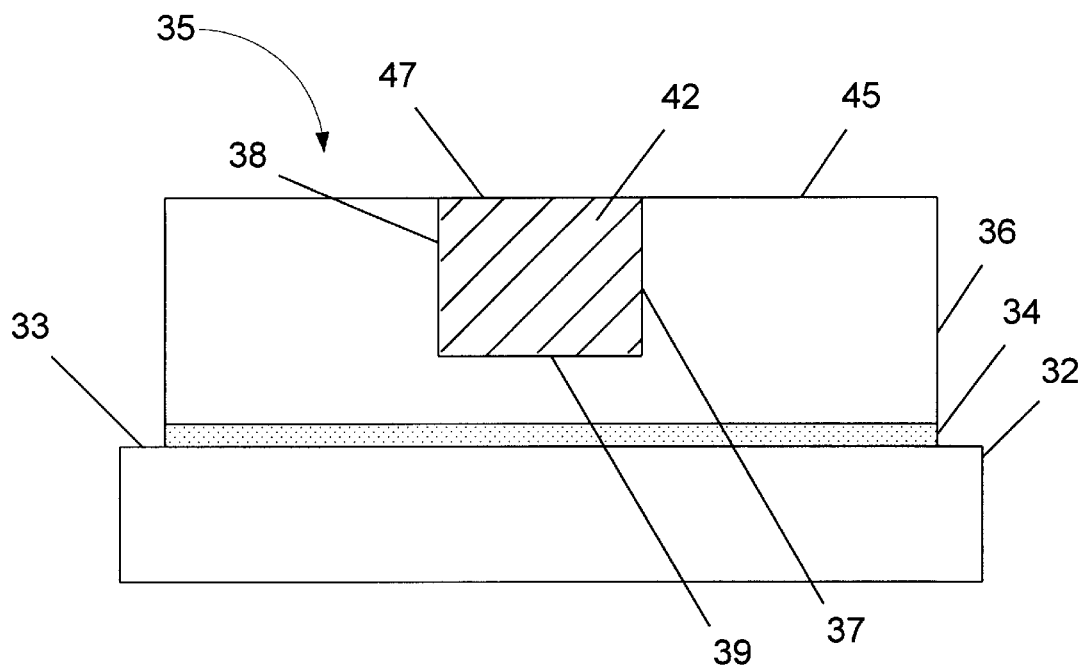
FIG. 5 is a cross-sectional view of the device shown in FIG. 4 after a planarization operation has been performed.

Next, as shown in FIG. 5, a planarization operation, e.g., a chemical mechanical planarization ("CMP") process, is performed to remove excess portions of the metal layer 40 above a surface 45 of the gate electrode layer 36. This results in the definition of a metal region 42 in the recess 38. After this process, the surface 45 of the gate electrode layer 36 is approximately planar with a surface 47 of the metal region 42.

Figure 6:
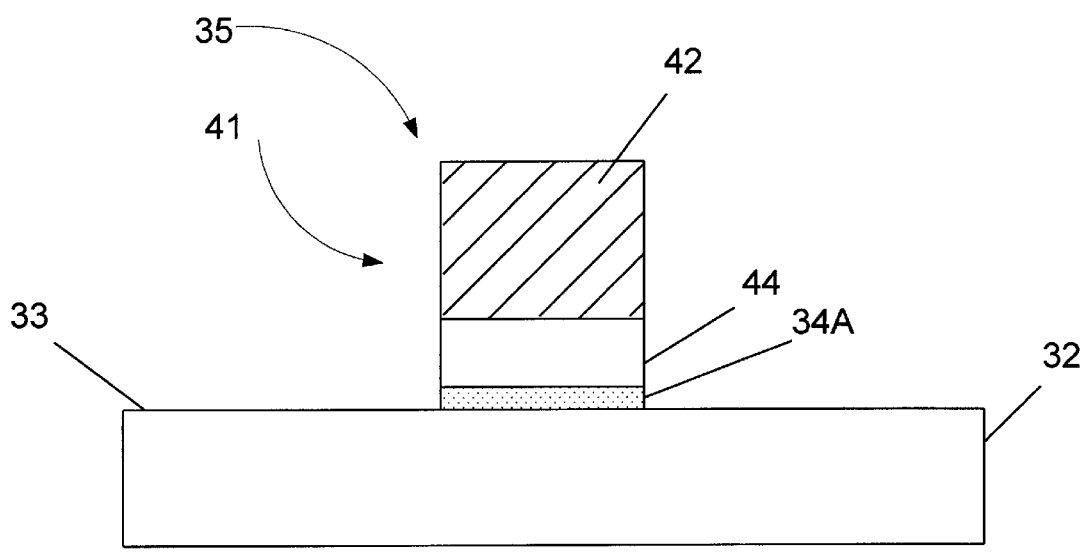
FIG. 6 is a cross-sectional view of the device shown in FIG. 5 after a patterning operation has been performed to define a gate stack of an illustrative semiconductor device.
Figure 7:
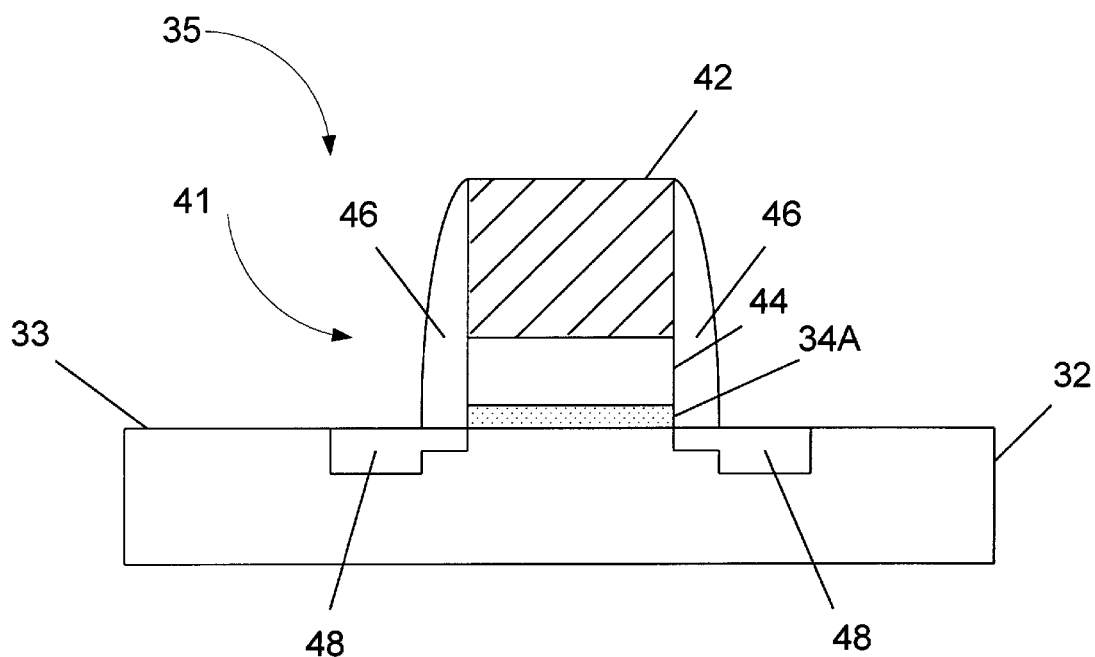
FIG. 7 is a cross-sectional view of the device depicted in FIG. 6 after additional is processing operations have been performed to further complete the semiconductor device.

Next, as shown in FIG. 6, one or more etching processes are performed to define a gate stack 41. The gate stack 41 is comprised of the metal region 42, a layer of polysilicon 44, and a gate dielectric layer 34A. In one illustrative embodiment, the metal region 42 serves as a hard mask for purposes of defining the gate stack 41. Thereafter, as shown in FIG. 7, additional processing operations are performed to complete the formation of the transistor 35. For example, sidewall spacers 46 may be formed adjacent the gate stack 41 and a plurality of source/drain regions 48 may be formed in the substrate 32. The methods and techniques used to form these various components are well known to those skilled in the art and will not be repeated herein. However, due to the inclusion of the metal region 42, lower temperature processing may have to be used to complete the formation of the device.

The present invention results in a transistor having a gate electrode with a resistance less than that of prior art structures. In particular, the gate electrode comprised of the metal region 42 and the layer of polysilicon 44 exhibits a reduced resistance due to the thickness of the metal region 42 as compared to the metal silicide region 21 formed above the gate electrode 18 in the device depicted in FIG. 1. Moreover, since the metal region 42 is comprised of a metal, e.g., copper, aluminum, etc., it inherently has a lower resistance than that of a metal silicide region commonly formed on gate electrodes using existing prior art techniques. Thus, the present invention may be used to improve device performance.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:

forming a layer of polysilicon;

forming a recess in said layer of polysilicon;

forming a metal region in said recess; and patterning said layer of polysilicon to define a gate stack comprised of said metal region and a layer of polysilicon.

2. The method of claim 1, wherein forming a layer of polysilicon comprises depositing a layer of polysilicon.

3. The method of claim 1, wherein forming a recess in said layer of polysilicon comprises etching a recess in said layer of polysilicon.

4. The method of claim 1, wherein forming a recess in said layer of polysilicon comprises etching an elongated rectangular recess in said layer of polysilicon.

5. The method of claim 1, wherein forming a metal region in said recess comprises depositing a metal in said recess.

6. The method of claim 1, wherein forming a metal region in said recess comprises forming a metal region comprised of at least one of copper, aluminum, tungsten and titanium nitride in said recess.

7. The method of claim 1, wherein forming a metal region in said recess comprises:

depositing a layer of metal above said layer of polysilicon and in said recess; and performing a planarization operation on said layer of metal to define a metal region in said recess.

8. The method of claim 1, wherein patterning said layer of polysilicon to define a gate stack comprised of said metal region and a layer of polysilicon comprises etching said layer of polysilicon to define a gate stack comprised of said metal region and a layer of polysilicon.

9. The method of claim 1, wherein patterning said layer of polysilicon to define a gate stack comprised of said metal region and a layer of polysilicon comprises etching said layer of polysilicon using said metal region as a hard mask to define a gate stack comprised of said metal region and a layer of polysilicon.

10. A method, comprising:

depositing a layer of polysilicon;

etching a recess in said layer of polysilicon;

forming a layer of metal above said layer of polysilicon and in said recess;

performing a planarization operation on said layer of metal to define a metal region in said recess; and etching said layer of polysilicon using said metal region as a hard mask to define a gate stack comprised of said metal region and a layer of polysilicon.

11. The method of claim 10, wherein etching a recess in said layer of polysilicon comprises etching an elongated rectangular recess in said layer of polysilicon.

12. The method of claim 10, wherein forming a metal region in said recess comprises forming a metal region comprised of at least one of copper, aluminum, tungsten and titanium nitride in said recess.

13. A method, comprising:

depositing a layer of polysilicon;

etching an elongated rectangular recess in said layer of polysilicon;

forming a layer of metal above said layer of polysilicon and in said recess;

performing a planarization operation on said layer of metal to define a metal region in said recess; and etching said layer of polysilicon using said metal region as a hard mask to define a gate stack comprised of said metal region and a layer of polysilicon.

14. The method of claim 13, wherein forming a metal region in said recess comprises forming a metal region comprised of at least one of copper, aluminum, tungsten and titanium nitride in said recess.

\* \* \* \* \*